(12) United States Patent
Nishido et al.

(10) Patent No.: US 9,231,042 B2
(45) Date of Patent: Jan. 5, 2016

(54) LIGHT-EMITTING DEVICE

(71) Applicants: Yusuke Nishido, Atsugi (JP); Yoshiharu Hirakata, Ebina (JP); Shigetsugu Yamanaka, Osaka (JP)

(72) Inventors: Yusuke Nishido, Atsugi (JP); Yoshiharu Hirakata, Ebina (JP); Shigetsugu Yamanaka, Osaka (JP)

(73) Assignees: Semiconductor Energy Laboratory Co., Ltd., Atsugi-shi, Kanagawa-ken (JP); Sharp Kabushiki Kaisha, Osaka-shi, Osaka (JP)

( * ) Notice: Subject to any disclaimer, the term of this patent is extended or adjusted under 35 U.S.C. 154(b) by 0 days.

(21) Appl. No.: 14/172,131

(22) Filed: Feb. 4, 2014

(65) Prior Publication Data

US 2014/0225140 A1 Aug. 14, 2014

(30) Foreign Application Priority Data

Feb. 12, 2013 (JP) ................................. 2013-024342

(51) Int. Cl.
*H01L 33/36* (2010.01)
*H01L 27/32* (2006.01)
*H01L 51/52* (2006.01)

(52) U.S. Cl.
CPC ........ *H01L 27/3276* (2013.01); *H01L 51/5203* (2013.01); *H01L 51/5265* (2013.01)

(58) Field of Classification Search
USPC .................................................... 257/98, 99
See application file for complete search history.

(56) References Cited

U.S. PATENT DOCUMENTS

| 5,119,156 | A  | 6/1992  | Kawahara et al. |
| 6,373,453 | B1 | 4/2002  | Yudasaka |
| 6,392,722 | B1 | 5/2002  | Sekime et al. |
| 6,420,834 | B2 | 7/2002  | Yamazaki et al. |
| 6,469,439 | B2 | 10/2002 | Himeshima et al. |
| 6,555,968 | B2 | 4/2003  | Yamazaki et al. |
| 6,559,594 | B2 | 5/2003  | Fukunaga et al. |
| 6,597,121 | B2 | 7/2003  | Imura |
| 6,614,174 | B1 | 9/2003  | Urabe et al. |
| 6,618,029 | B1 | 9/2003  | Ozawa |
| 6,720,198 | B2 | 4/2004  | Yamagata et al. |
| 6,750,618 | B2 | 6/2004  | Yamazaki et al. |
| 6,768,257 | B1 | 7/2004  | Yamada et al. |

(Continued)

FOREIGN PATENT DOCUMENTS

| JP | 11-339958 A   | 12/1999 |
| JP | 2001-148291 A | 5/2001  |

(Continued)

*Primary Examiner* — Zandra Smith
*Assistant Examiner* — Lawrence Tynes, Jr.
(74) *Attorney, Agent, or Firm* — Eric J. Robinson; Robinson Intellectual Property Law Office, P.C.

(57) ABSTRACT

Occurrence of a crosstalk phenomenon in a light-emitting device is inhibited. A light-emitting device including an insulating layer 416; a first lower electrode 421*a* formed over the insulating layer; a second lower electrode 421*b* formed over the insulating layer; a partition 418 formed over the insulating layer and positioned between the first lower electrode and the second lower electrode; a stacked-layer film 423 which is formed over the first lower electrode, the partition, and the second lower electrode and includes a light-emitting layer containing a light-emitting substance and a layer having higher conductivity than that of the light-emitting layer; an upper electrode 422 formed over the stacked-layer film; and a shield electrode 419 which is formed under the partition and does not overlap with the first lower electrode and the second lower electrode.

23 Claims, 8 Drawing Sheets

(56) References Cited

U.S. PATENT DOCUMENTS

| | | |
|---|---|---|
| 6,798,132 B2 | 9/2004 | Satake |
| 6,815,723 B2 | 11/2004 | Yamazaki et al. |
| 6,828,726 B2 | 12/2004 | Sakurai et al. |
| 6,969,291 B2 | 11/2005 | Urabe et al. |
| 6,991,506 B2 | 1/2006 | Yamada et al. |
| 6,992,439 B2 | 1/2006 | Yamazaki et al. |
| 7,015,503 B2 | 3/2006 | Seki et al. |
| 7,057,209 B2 | 6/2006 | Yamazaki et al. |
| 7,098,602 B2 | 8/2006 | Yamazaki et al. |
| 7,173,281 B2 | 2/2007 | Hirakata et al. |
| 7,214,959 B2 | 5/2007 | Seki et al. |
| 7,221,338 B2 | 5/2007 | Yamazaki et al. |
| 7,265,391 B2 | 9/2007 | Yamazaki et al. |
| 7,273,801 B2 | 9/2007 | Seki et al. |
| 7,384,860 B2 | 6/2008 | Nakamura et al. |
| 7,402,948 B2 | 7/2008 | Yamazaki et al. |
| 7,420,210 B2 | 9/2008 | Yamazaki et al. |
| 7,423,293 B2 | 9/2008 | Yamagata et al. |
| 7,442,955 B2 | 10/2008 | Seki et al. |
| 7,585,761 B2 | 9/2009 | Yamazaki et al. |
| 7,623,098 B2 | 11/2009 | Yamazaki et al. |
| 7,623,099 B2 | 11/2009 | Yamazaki et al. |
| 7,623,100 B2 | 11/2009 | Yamazaki et al. |
| 7,662,011 B2 | 2/2010 | Yamazaki et al. |
| 7,683,535 B2 | 3/2010 | Fukunaga et al. |
| 7,692,186 B2 | 4/2010 | Yamazaki et al. |
| 7,697,106 B2 | 4/2010 | Sawasaki et al. |
| 7,719,014 B2 | 5/2010 | Yamazaki et al. |
| 7,745,993 B2 | 6/2010 | Fukunaga et al. |
| 7,753,751 B2 | 7/2010 | Yamazaki |
| 7,792,489 B2 | 9/2010 | Hirakata et al. |
| 7,902,746 B2 | 3/2011 | Park |
| 7,932,518 B2 | 4/2011 | Seki et al. |
| 7,977,876 B2 | 7/2011 | Yamazaki et al. |
| 7,982,206 B2 | 7/2011 | Yamazaki et al. |
| 7,990,348 B2 | 8/2011 | Yamazaki et al. |
| 8,026,531 B2 | 9/2011 | Seo et al. |
| 8,089,066 B2 | 1/2012 | Yamazaki et al. |
| 8,119,468 B2 | 2/2012 | Miyairi et al. |
| 8,138,032 B2 | 3/2012 | Miyairi et al. |
| 8,194,008 B2 | 6/2012 | Yamazaki et al. |
| 8,237,355 B2 | 8/2012 | Yamazaki |
| 8,432,097 B2 | 4/2013 | Hirakata et al. |
| 8,441,185 B2 | 5/2013 | Kuwabara et al. |
| 8,581,275 B2 | 11/2013 | Omoto |
| 2001/0004469 A1 | 6/2001 | Himeshima et al. |
| 2002/0047514 A1 | 4/2002 | Sakurai et al. |
| 2002/0093286 A1 | 7/2002 | Ohshita et al. |
| 2003/0146439 A1 | 8/2003 | Yamazaki et al. |
| 2003/0189400 A1 | 10/2003 | Nishio et al. |
| 2004/0061118 A1 | 4/2004 | Yamazaki et al. |
| 2005/0073243 A1* | 4/2005 | Yamazaki et al. ............ 313/498 |
| 2005/0161740 A1* | 7/2005 | Park et al. .................... 257/347 |
| 2006/0081844 A1 | 4/2006 | Hirosue et al. |
| 2007/0015430 A1 | 1/2007 | Nishio et al. |
| 2007/0045621 A1 | 3/2007 | Suzuki et al. |
| 2007/0085847 A1* | 4/2007 | Shishido ...................... 345/204 |
| 2007/0194321 A1 | 8/2007 | Yamazaki et al. |
| 2009/0009069 A1 | 1/2009 | Takata |
| 2009/0020751 A1 | 1/2009 | Seki et al. |
| 2010/0171138 A1 | 7/2010 | Yamazaki et al. |
| 2011/0266548 A1 | 11/2011 | Yamazaki et al. |
| 2011/0273080 A1 | 11/2011 | Kimura et al. |
| 2012/0007110 A1 | 1/2012 | Seo et al. |
| 2012/0092872 A1* | 4/2012 | Yoshioka et al. ............. 362/293 |
| 2012/0187425 A1 | 7/2012 | Omoto |
| 2012/0217516 A1 | 8/2012 | Hatano et al. |
| 2012/0273804 A1 | 11/2012 | Hatano |
| 2012/0305922 A1 | 12/2012 | Yamazaki |
| 2013/0001620 A1* | 1/2013 | Sugisawa et al. ............... 257/98 |
| 2013/0032841 A1* | 2/2013 | Jinbo et al. ..................... 257/98 |
| 2014/0103368 A1 | 4/2014 | Hatano et al. |
| 2014/0103385 A1 | 4/2014 | Hatano et al. |
| 2014/0104151 A1 | 4/2014 | Yamazaki et al. |
| 2014/0175469 A1 | 6/2014 | Dozen et al. |
| 2014/0175470 A1 | 6/2014 | Yokoyama et al. |

FOREIGN PATENT DOCUMENTS

| | | |
|---|---|---|
| JP | 2001-195008 A | 7/2001 |
| JP | 2003-059671 A | 2/2003 |
| JP | 2003-123969 A | 4/2003 |
| JP | 2003-243171 A | 8/2003 |
| JP | 2003-257650 A | 9/2003 |
| JP | 2005-235491 A | 9/2005 |
| JP | 2006-302870 A | 11/2006 |
| JP | 2007-141821 A | 6/2007 |
| JP | 2008-234885 A | 10/2008 |
| JP | 2010-027591 A | 2/2010 |
| JP | 2012-155953 A | 8/2012 |

* cited by examiner

LIGHT-EMITTING DEVICE

BACKGROUND OF THE INVENTION

1. Field of the Invention

The present invention relates to a light-emitting device that has a light-emitting element.

2. Description of the Related Art

Commercialization of organic EL displays is accelerating. The required luminance of displays is becoming higher year by year for outdoor use. It is known that the luminance of an organic EL element increases in proportion to electric current, and light emission at high luminance can be achieved.

However, a large current flow accelerates deterioration of organic EL elements. Thus, if high luminance can be achieved with a small amount of current, light-emitting elements can have longer lifetimes. In this regard, a tandem element in which a plurality of light-emitting units is stacked has been proposed as a light-emitting element capable of providing high luminance with a small amount of current (see Patent Document 1, for example).

Note that in this specification, a light-emitting unit refers to a layer or a stacked body which includes one region where electrons and holes injected from both ends recombine.

A tandem element including two light-emitting units, for example, can emit light equivalent to that of a light-emitting element including one light-emitting unit by current with half the density of the light-emitting element including one light-emitting unit. In addition, a structure in which n light-emitting units are stacked between electrodes, for example, can provide n times the luminance of one light-emitting unit without increasing current density.

One problem of a light-emitting panel in which tandem elements are provided adjacently is occurrence of a crosstalk phenomenon. The crosstalk phenomenon refers to a phenomenon in which, when a light-emitting layer and a layer having higher conductivity than that of the light-emitting layer are provided in a plurality of sub-pixels as common layers, current leaks to an adjacent sub-pixel through the layer with higher conductivity. For example, when a tandem element has a structure in which a first light-emitting unit including a first light-emitting layer and a second light-emitting unit including a second light-emitting layer are stacked and an intermediate layer having higher conductivity than the conductivity of the first light-emitting layer and that of the second light-emitting layer is provided between the first and second light-emitting units, current leaks to an adjacent tandem element through the intermediate layer. Note that a problem of a crosstalk phenomenon similarly occurs in a single element in which a carrier-injection layer (a hole-injection layer or an electron-injection layer) is used as a common layer.

A tandem element includes stacked layers with a highly conductive intermediate layer therebetween, thereby including a layer with high conductivity and a layer with low conductivity in the structure. In addition, in the tandem element, a mixed layer of an organic compound and a metal oxide or a highly conductive carrier-injection layer of a conductive high molecular compound or the like is often used in order to decrease driving voltage. Furthermore, electrical resistance between an anode and a cathode is higher in the tandem element than in a single element; thus, current is easily transmitted to an adjacent pixel through the highly conductive layer.

FIG. 8A is a schematic diagram for describing the crosstalk phenomenon caused by a highly conductive intermediate layer 86. In the cross-sectional view of FIG. 8A, three stripes of tandem elements that emit white light are arranged in a light-emitting panel (white-light-emitting panel) and only a second tandem element is driven.

The light-emitting panel includes first to third tandem elements which are adjacent to one another. The first tandem element is provided between an upper electrode 81 and a first lower electrode 82. The second tandem element is provided between the upper electrode 81 and a second lower electrode 83. The third tandem element is provided between the upper electrode 81 and a third lower electrode 84.

In each of the first to third tandem elements, a first light-emitting unit 85, the intermediate layer 86, and a second light-emitting unit 87 are sequentially stacked. For example, when the first light-emitting unit 85 includes a light-emitting layer that emits blue light and the second light-emitting unit 87 includes a light-emitting layer that emits green light and a light-emitting layer that emits red light, each tandem element can provide white light emission.

In the case of using a light-transmitting upper electrode, a counter glass substrate 88 can be arranged over the upper electrode and reflective electrodes can be used as the lower electrodes. The counter glass substrate 88 is provided with a blue color filter, a red color filter, and a green color filter (not illustrated). The red color filter, the blue color filter, and the green color filter overlap with the first lower electrode 82, the second lower electrode 83, and the third lower electrode 84, respectively.

When only the blue line (the second tandem element) is driven in the above-described light-emitting panel by application of voltage between the second lower electrode 83 and the upper electrode 81, current might leak to the adjacent first or third tandem element through the highly conductive intermediate layer 86, causing the red line (the first tandem element) or the green line (the third tandem element) to emit light and a crosstalk phenomenon to occur.

FIG. 8B is a schematic diagram for describing the crosstalk phenomenon caused by a highly conductive carrier-injection layer (a hole-injection or electron-injection layer) 89. In FIG. 8B, only a blue line (a second tandem element) is driven in a light-emitting panel (white-light-emitting panel).

In each of first to third tandem elements, the first light-emitting unit 85 including the highly conductive carrier-injection layer 89, the intermediate layer 86, and the second light-emitting unit 87 are sequentially stacked. As an example of the carrier-injection layer 89, a highly conductive layer containing a mixed material of an organic compound and a metal oxide, a conductive high molecular compound, or the like can be given.

REFERENCE

Patent Document

[Patent Document 1] Japanese Published Patent Application No. 2008-234885

SUMMARY OF THE INVENTION

An object of one embodiment of the present invention is to prevent occurrence of a crosstalk phenomenon in a light-emitting device.

One embodiment of the present invention is a light-emitting device which includes an insulating layer; a first lower electrode formed over the insulating layer; a second lower electrode formed over the insulating layer; a partition formed over the insulating layer and positioned between the first lower electrode and the second lower electrode; a stacked-layer film which is formed over the first lower electrode, the partition, and the second lower electrode and includes a light-emitting layer containing a light-emitting substance and a layer having higher conductivity than the conductivity of the light-emitting layer; an upper electrode formed over the stacked-layer film; and a third electrode which is formed under the partition and does not overlap with the first lower electrode and the second lower electrode.

In the above embodiment of the present invention, the third electrode is preferably provided so as to separate the first lower electrode and the second lower electrode.

In the above embodiment of the present invention, the third electrode is preferably formed over the insulating layer.

In the above embodiment of the present invention, the third electrode is preferably formed using the same layer as the first lower electrode.

It is preferable that the above embodiment of the present invention further include at least one of an optical adjustment layer formed between the first lower electrode and the stacked-layer film and an optical adjustment layer formed between the second lower electrode and the stacked-layer film, and that the third electrode be a stack which includes a layer formed using the same layer as the first lower electrode and a layer formed using the same layer as the optical adjustment layer.

In the above embodiment of the present invention, the third electrode is preferably formed under the insulating layer. The insulating layer may be a single layer or a stack including a plurality of layers.

It is preferable that the above embodiment of the present invention further include a transistor formed under the insulating layer, the transistor include a semiconductor layer, a gate electrode, a source electrode, and a drain electrode, and the third electrode be formed using the same layer as the source electrode.

It is preferable that the above embodiment of the present invention further include a transistor formed under the insulating layer, the transistor include a semiconductor layer, a gate electrode, a source electrode, and a drain electrode, and the third electrode be formed using the same layer as the gate electrode.

Further, in the above embodiment of the present invention, the third electrode may be in an electrically floating state.

In the above embodiment of the present invention, it is preferable that voltage lower than voltage applied at a higher potential to the first lower electrode or the upper electrode to make the light-emitting layer provided between the first lower electrode and the upper electrode emit light be applied to the third electrode.

Further, in the above embodiment of the present invention, it is preferable that voltage lower than or equal to the sum of threshold voltage at which the light-emitting layer starts to emit light and voltage applied at a lower potential to the first lower electrode or the upper electrode be applied to the third electrode.

It is preferable that the above embodiment of the present invention further include a color filter near or in contact with the upper electrode positioned over the partition, and the color filter include a color filter with a first color overlapping with the first lower electrode and a color filter with a second color overlapping with the second lower electrode.

One embodiment of the present invention is a light-emitting device which includes an insulating layer; a plurality of lower electrodes formed over the insulating layer; a partition formed over the insulating layer, positioned between the plurality of lower electrodes, and surrounding each of the plurality of lower electrodes; a stacked-layer film which is formed over the plurality of lower electrodes and the partition and includes a light-emitting layer containing a light-emitting substance and a layer having higher conductivity than the conductivity of the light-emitting layer; an upper electrode formed over the stacked-layer film; and a third electrode formed under the partition, not overlapping with the plurality of lower electrodes, and surrounding each of the plurality of lower electrodes.

Note that a light-emitting device in this specification includes a display device having a light-emitting element in a pixel (or a sub-pixel). A light-emitting panel includes a display panel where pixels each having a light-emitting element are provided adjacently. Note that the light-emitting element has a light-emitting unit including a light-emitting layer.

With one embodiment of the present invention, occurrence of a crosstalk phenomenon can be prevented.

DETAILED DESCRIPTION OF THE INVENTION

Embodiments of the present invention will be described in detail below with reference to the accompanying drawings. However, the present invention is not limited to the following description and it is easily understood by those skilled in the art that the mode and details can be variously changed without departing from the scope and spirit of the present invention. Therefore, the invention should not be construed as being limited to the description in the following embodiments.

Embodiment 1

<Display Panel Structure>

Figure 1A:
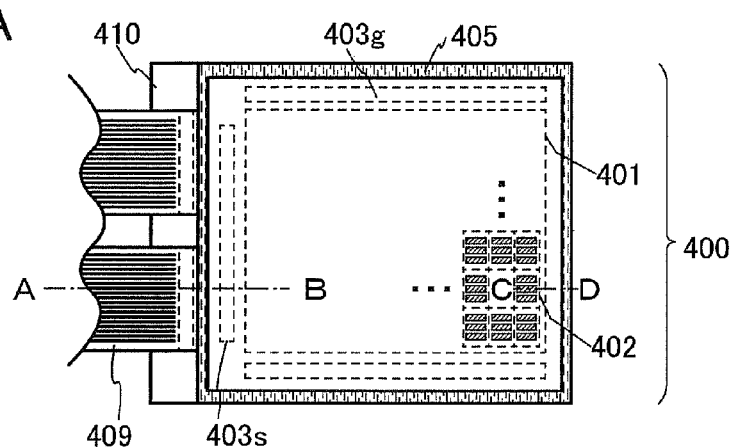
FIG. 1A is a top view illustrating a structure of a display panel that can be used for a display device of one embodiment of the present invention.
Figure 1B:
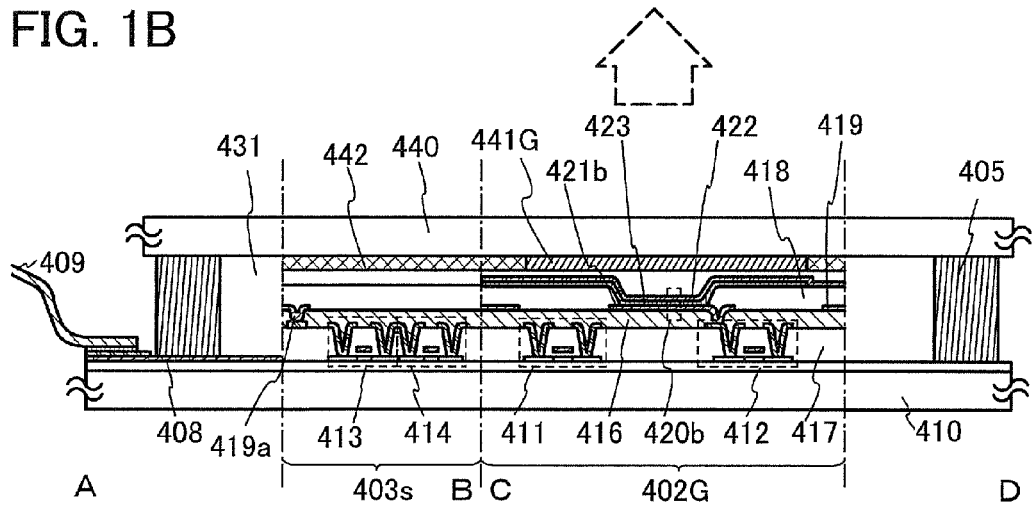
FIG. 1B is a side view illustrating the cross section of the structure along section lines A-B and C-D in FIG. 1A.

FIGS. 1A and 1B illustrate a structure of a display panel that can be used for a display device of one embodiment of the present invention. FIG. 1A is a top view of the structure of the display panel which can be used for a display device of one embodiment of the present invention, and FIG. 1B is a side view illustrating the cross section of the structure along section lines A-B and C-D in FIG. 1A.

A display panel 400 shown as an example in this embodiment includes a display portion 401 over a first substrate 410.

The display portion 401 includes a plurality of pixels 402. The pixel 402 includes a plurality of sub-pixels (e.g., three sub-pixels) (see FIG. 1A). Over the first substrate 410, in addition to the display portion 401, a source side driver circuit portion 403s and a gate side driver circuit portion 403g which drive the display portion 401 are provided. Note that the driver circuit portions can be provided not over the first substrate 410 but outside the substrate.

The display panel 400 includes an external input terminal and receives a video signal, a clock signal, a start signal, a reset signal, and the like from a flexible printed circuit (FPC) 409.

A sealant 405 bonds the first substrate 410 and a second substrate 440. The display portion 401 is provided in a space 431 formed between the substrates (see FIG. 1B).

The structure of the cross sections of the display panel 400 is described with reference to FIG. 1B. The display panel 400 includes the source side driver circuit portion 403s, a sub-pixel 402G included in the pixel 402, and a lead wiring 408. Note that the display portion 401 of the display panel 400 shown as an example in this embodiment emits light in the direction denoted by the arrow in the drawing, thereby displaying images.

The source side driver circuit portion 403s includes a CMOS circuit which is a combination of an n-channel transistor 413 and a p-channel transistor 414. The n-channel transistor 413 and the p-channel transistor 414 are formed in the insulating layer 417. Note that the driver circuit is not limited to this structure and may be various circuits, such as a CMOS circuit, a PMOS circuit, or an NMOS circuit.

The lead wiring 408 transmits a signal input from an external input terminal to the source side driver circuit portion 403s and the gate side driver circuit portion 403g.

The sub-pixel 402G includes a switching transistor 411, a current control transistor 412, a second light-emitting element 420b, and a color filter 441G. The switching transistor 411 and the current control transistor 412 are formed in the insulating layer 417. Further, a third electrode (hereinafter also referred to as shield electrode) 419 is provided between the sub-pixel 402G and an adjacent sub-pixel. An insulating layer 416 and a partition 418 are formed over the insulating layer 417, the transistor 411, and the like. Note that in FIGS. 1A and 1B, the shield electrode 419 is electrically connected to the driver circuit portion 403s in the terminal portion 419a.

The second light-emitting element 420b includes a second lower electrode 421b, an upper electrode 422, and a layer 423 containing a light-emitting organic compound (hereinafter also referred to as an EL layer) which is provided between the second lower electrode 421b and the upper electrode 422. In the second light-emitting element 420b, an electrode which transmits light from the EL layer 423 is used as the electrode on the light emission side, and a material which reflects the light is used for the electrode on a side opposite to the light emission side. In addition, the color filter 441G is provided on the light emission side. In the second light-emitting element 420b shown as an example in this embodiment, the second lower electrode 421b has a light-reflecting property and the upper electrode 422 has a light-transmitting property. Note that the image displaying direction of the display portion 401 is determined in accordance with the direction in which light emitted from the second light-emitting element 420b is extracted.

In addition, a light-blocking film 442 is formed so as to surround the color filter 441G. The light-blocking film 442 prevents a phenomenon in which the display panel 400 reflects outside light and has an effect of increasing the contrast of images displayed on the display portion 401. Note that the color filter 441G and the light-blocking film 442 are formed on the second substrate 440.

The insulating layer 416 is an insulating layer for planarizing a step due to the structure of the transistor 411 and the like or for preventing impurity diffusion to the transistor 411 and the like. The insulating layer 416 can be a single layer or a plurality of stacked layers. The partition 418 is an insulating layer having an opening; the second light-emitting element 420b is formed in the opening of the partition 418.

<Transistor Structure>

Top-gate transistors are used in the display panel 400 illustrated as an example in FIGS. 1A and 1B. However, the present invention is not limited to this example, and bottom-gate transistors may be used as well. Various types of transistors can be used for the source side driver circuit portion 403s, the gate side driver circuit portion 403g, and the sup-pixels. Note that various semiconductors can be used for a region where channels of these transistors are formed. Specifically, as well as amorphous silicon, polysilicon, or single crystal silicon, an oxide semiconductor or the like can be used. As an example of an oxide semiconductor, an oxide semiconductor containing at least indium (In) or zinc (Zn) can be given, and an oxide semiconductor containing In and Zn is preferable. Further, these oxide semiconductors containing gallium (Ga) or tin (Sn) or both of them are particularly preferable.

In the case of using a single crystal semiconductor for a region where a channel of a transistor is formed, the size of the transistor can be reduced, which results in higher resolution pixels in a display portion.

As a single crystal semiconductor used for forming a semiconductor layer, a semiconductor substrate, such as a single crystal silicon substrate, or a silicon on insulator (SOI) substrate in which a single crystal semiconductor layer is provided on an insulating surface can be used.

<Sealing Structure>

The display panel 400 illustrated as an example in this embodiment has a structure in which the light-emitting element is sealed in the space 431 enclosed by the first substrate 410, the second substrate 440, and the sealant 405 (see FIGS. 1A and 1B).

The space 431 can be filled with an inert gas (e.g., nitrogen or argon) or resin. An absorbent for impurities (typically, water and/or oxygen) such as a dry agent may be provided in the space 431.

The sealant 405 and the second substrate 440 are desirably formed using a material which does not transmit impurities in the air (typically, water and/or oxygen) as much as possible. An epoxy-based resin, glass frit, or the like can be used as the sealant 405.

Examples of the second substrate 440 include a glass substrate; a quartz substrate; a plastic substrate formed of poly (vinyl fluoride) (PVF), polyester, an acrylic resin, or the like; a substrate of fiberglass-reinforced plastics (FRP); and the like.

<Pixel Configuration 1>

Figure 2A:
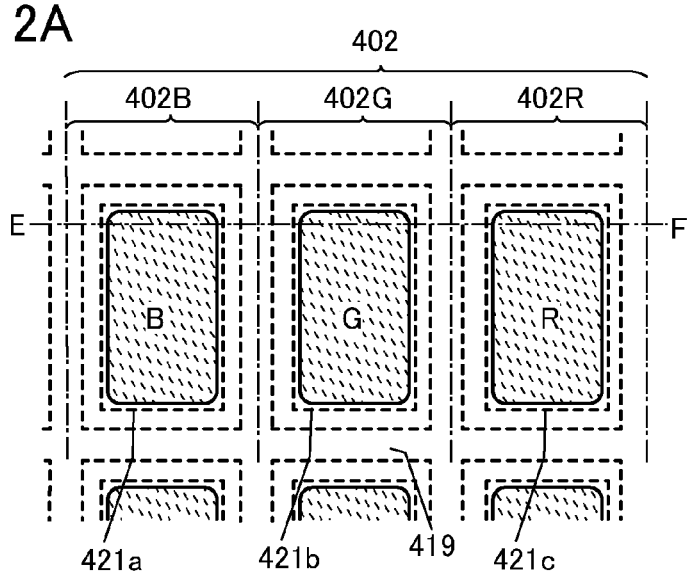
FIG. 2A is a top view illustrating a pixel.
Figure 2B:
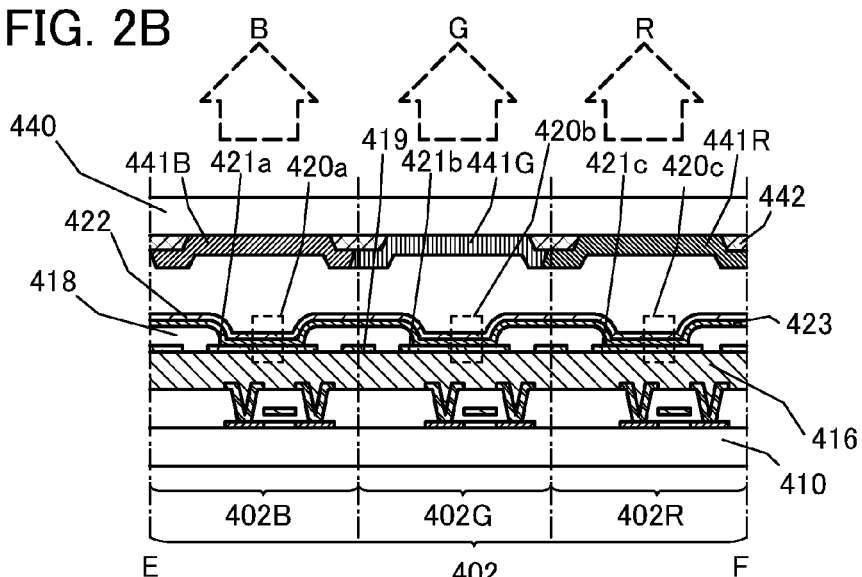
FIG. 2B is a side view illustrating the cross section of the structure along a section line E-F in FIG. 2A, and FIGS. 2C and 2D are equivalent circuit diagrams each illustrating a sub-pixel 402G.
Figure 2C:
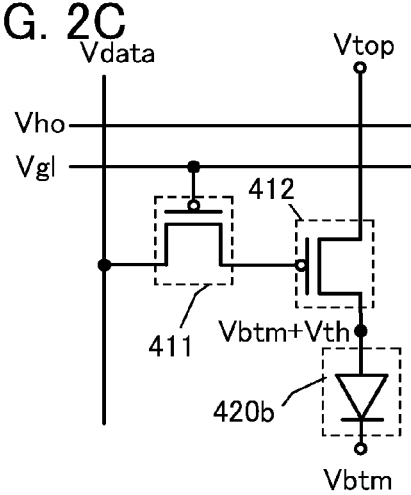

The structure of the pixel 402 included in the display portion 401 is described with reference to FIGS. 2A to 2D. FIG. 2A is a plan view illustrating the pixel 402, FIG. 2B is a cross-sectional view along a section line E-F in FIG. 2A, and FIG. 2C is an equivalent circuit diagram illustrating a sub-pixel 402G. Note that in the plan view of FIG. 2A, some components (e.g., color filters 441B to 441R) of the pixel 402 are omitted in order to avoid complexity of the drawing.

The pixel 402 described in this embodiment as an example includes the sub-pixel 402B that emits blue light B, the sub-pixel 402G that emits green light G, and a sub-pixel 402R that emits red light R. The sub-pixel 402B includes a driver transistor, a first light-emitting element 420a, and the color filter 441B. The sub-pixel 402G includes a driver transistor, the second light-emitting element 420b, and the color filter 441G. The sub-pixel 402R includes a driver transistor, a third light-emitting element 420c, and the color filter 441R. The first light-emitting element 420a includes a first lower electrode 421a, the upper electrode 422, and the EL layer 423. The second light-emitting element 420b includes the second lower electrode 421b, the upper electrode 422, and the EL layer 423. The third light-emitting element 420c includes a third lower electrode 421c, the upper electrode 422, and the EL layer 423.

The EL layer 423 is a stacked-layer film which includes at least a light-emitting layer containing a light-emitting substance and a layer having higher conductivity than that of the light-emitting layer. As examples of the layer having higher conductivity than that of the light-emitting layer, a carrier-injection layer (a hole-injection layer or an electron-injection layer) and an intermediate layer can be given. In this embodiment, the EL layer 423 includes a first light-emitting unit, a second light-emitting unit, and an intermediate layer provided between the first light-emitting unit and the second light-emitting unit. The intermediate layer has higher conductivity than the conductivity of the first light-emitting unit and that of the second light-emitting unit.

The light-emitting unit includes at least one light-emitting layer containing a light-emitting substance, and may have a structure in which the light-emitting layer and a layer other than the light-emitting layer are stacked. Examples of the layer other than the light-emitting layer are layers which contain a substance having a high hole-injection property, a substance having a high hole-transport property, a substance having a poor hole-transport property (substance which blocks holes), a substance having a high electron-transport property, a substance having a high electron-injection property, a substance having a bipolar property (substance having high electron- and hole-transport properties), and the like.

In the sub-pixel 402B, the color filter 441B through which blue light can be extracted is provided on the upper electrode 422 side so as to overlap with the first light-emitting element 420a (see FIG. 2B). In a similar manner, in the sub-pixel 402G, the color filter 441G through which green light can be extracted is provided so as to overlap with the second light-emitting element 420b. In the sub-pixel 402R, the color filter 441R through which red light can be extracted is provided so as to overlap with the third light-emitting element 420c. The first, second, and third light-emitting elements 420a, 420b, and 420c in the respective sub-pixels have the same structure. When a light-emitting element which emits white light comprising red, blue, and green light components is used as each of the first, second, and third light-emitting elements 420a, 420b, and 420c, a display panel capable of full-color display can be provided.

<<Shield Electrode 419>>

The shield electrode 419 in a lattice-like shape is provided so as to surround each of the sub-pixels 402B, 402G, and 402R. In other words, the shield electrode 419 is formed so as to surround each of the first to third lower electrodes 421a to 421c (see FIGS. 2A and 2B).

Over the insulating layer 416, the shield electrode 419 is formed using the same layer as the first to third lower electrodes 421a to 421c. Here, the expression "the shield electrode 419 is formed using the same layer as the first to third lower electrodes 421a to 421c" means that the shield electrode 419 is formed in the same process where the first to third lower electrodes 421a to 421c are formed.

The shield electrode 419 is formed under the partition 418 such that the shield electrode does not overlap with the first to third lower electrodes 421a to 421c. The shield electrode 419 is covered with the partition 418.

Figure 3A:
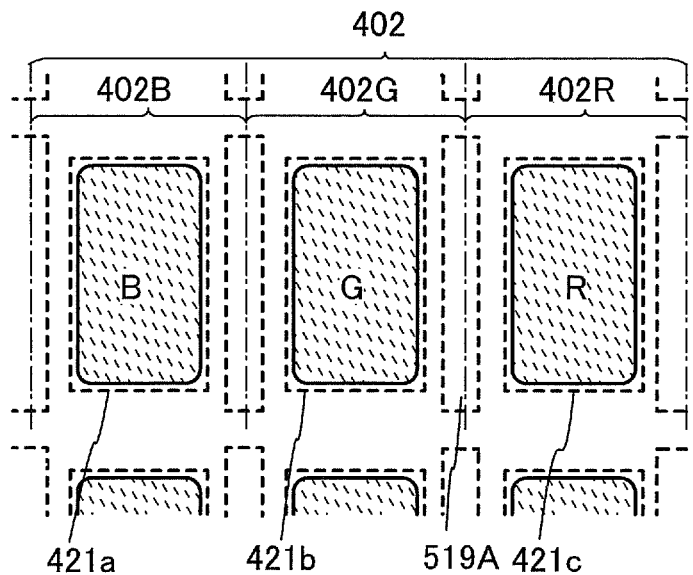
FIGS. 3A and 3B are top views of pixels.
Figure 3B:
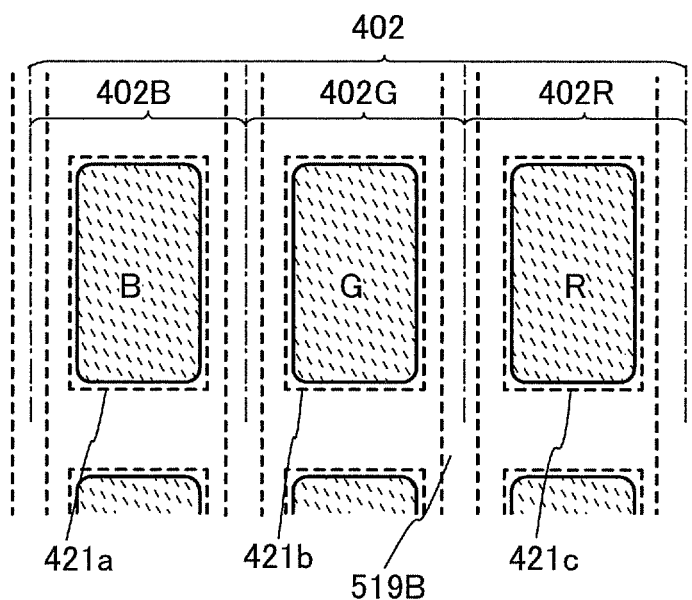

Note that although the shield electrode 419 is formed so as to surround each of the first to third lower electrodes 421a to 421c in the pixel configuration 1, the present invention is not limited to this configuration. For example, as illustrated in FIGS. 3A and 3B, the shield electrodes 419 are formed only between the first to third lower electrodes 421a to 421c. In other words, the shield electrodes 419 may be provided so as to separate the first to third lower electrodes 421a to 421c. That is, it is possible to employ a structure in which the shield electrodes 419 are formed between the sub-pixels of different colors and are not formed between the sub-pixels of the same color. Note that in the example illustrated in FIG. 3A, one shield electrode 519A is provided for one sub-pixel; in this case, the shield electrode 519A has a floating potential. In the example illustrated in FIG. 3B, shield electrodes 519B in a stripe-like shape are provided between the sub-pixels of different colors; in this case, the shield electrodes 519B may have a floating potential or may be electrically connected to the driver circuit portion 403s.

For example, the shield electrode 419 may have a floating potential (the shield electrode may be in an electrically floating state) without application of voltage thereto when the EL layer 423 between the second lower electrode 421b and the upper electrode 422 emits light, i.e., when the sub-pixel 402G emits light and the sub-pixels 402B and 402R do not emit light. Even when the shield electrode 419 has a floating potential, the shield electrode 419 provided between the sub-pixels can inhibit flow of leakage current to the EL layers 423 (specifically, the layers having higher conductivities than those of the light-emitting layers in the EL layers 423) of the adjacent sub-pixels 402B and 402R. Thus, the shield electrode 419 can inhibit occurrence of a crosstalk phenomenon in a light-emitting device. Note that when the shield electrode 419 has a floating potential, the shield electrode 419 is not electrically connected to the driver circuit portion 403s.

Further, in the case where the sub-pixel 402G emits light and the sub-pixels 402B and 402R do not emit light, it is preferable that voltage which is applied to the shield electrode 419 be lower than voltage which is applied to the higher potential side (anode) of the second light-emitting element 420b; it is further preferable that the voltage which is applied to the shield electrode 419 be lower than or equal to the sum of voltage applied to the lower potential side (cathode) and the threshold voltage of the second light-emitting element 420b. For example, in the case where the second light-emitting element 420b emits light with the second lower electrode 421b and the upper electrode 422 used as an anode and a cathode, respectively, it is preferable that voltage applied to the shield electrode 419 be lower than voltage applied to the second lower electrode 421b; it is further preferable that voltage applied to the shield electrode 419 be lower than or equal to the sum of voltage applied to the upper electrode 422 and the threshold voltage of the second light-emitting element 420b.

The voltage applied to the shield electrode 419 here is applied from the driver circuit portion 403s through the terminal portion 419a. Thus, current flowing through the second lower electrode 421b of the sub-pixel 402G can be prevented from flowing to the EL layers 423 (specifically, the layers having higher conductivities than those of the light-emitting layers in the EL layers 423) of the adjacent sub-pixels 402B and 402R, so that light emission from the adjacent sub-pixels 402B and 402R can be inhibited. Accordingly, occurrence of a crosstalk phenomenon in a light-emitting device can be inhibited.

Here, for a reduction of power consumption of a light-emitting device, voltage applied to the shield electrode 419 is preferably higher than or equal to voltage which is applied to the lower potential side (cathode) to make the second light-emitting element 420b emit light and lower than voltage which is applied to the higher potential side (anode) to make the second light-emitting element 420b emit light. Specifically, voltage applied to the shield electrode 419 is preferably equal to voltage which is applied to the lower potential side to make the second light-emitting element 420b emit light, in which case an external power supply for the shield electrode can also serve as an external power supply for the lower potential and the number of wirings connected to an external connection terminal can be thus reduced.

FIG. 2C illustrates an example where p-channel transistors are used as the switching transistor 411 and the current control transistor 412. One terminal of the switching transistor 411 in the green sub-pixel 402G is electrically connected to a signal line Vdata which applies pixel gray scale data signal voltage at the time when the transistor 411 is in an on state or an off state. A gate electrode of the switching transistor 411 is electrically connected to a selection line Vgl which applies pixel selection voltage. The other terminal of the switching transistor 411 is electrically connected to a gate electrode of the current control transistor 412 (see FIG. 2C). Voltage applied to the higher potential side of the second light-emitting element 420b is drain terminal voltage of the current control transistor 412, thereby depending on gate voltage of the transistor. Voltage applied to the lower potential side is Vbtm. However, the voltage applied to the higher potential side of the second light-emitting element 420b is Vbtm+Vth when a dark grayscale image is displayed (e.g., a gray level is 0). Note that Vth is threshold voltage of light emission of the second light-emitting element 420b. The shield electrode 419 is provided between the sub-pixel 402G and another sub-pixel (not shown in FIG. 2C) and voltage Vho is applied to the shield electrode. In this case, Vho which satisfies Vho≤Vbtm+Vth is applied. However, the shield electrode 419 may be in an electrically floating state.

Note that to the structure of the sub-pixel in FIG. 2C, an auxiliary capacitor may be added which is electrically connected to one electrode of the second light-emitting element 420b and the gate electrode of the current control transistor 412.

Figure 2D:
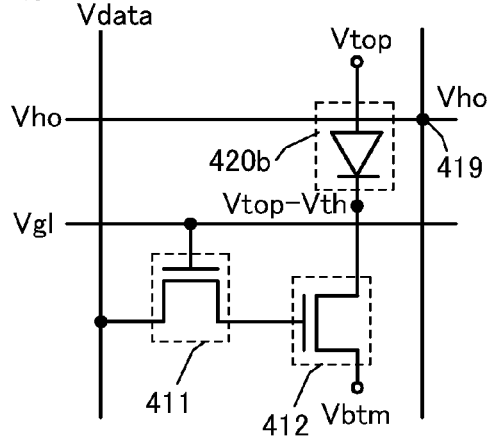

FIG. 2D illustrates an example where n-channel transistors are used as the switching transistor 411 and the current control transistor 412. In FIG. 2D, voltage applied to the higher potential side of the second light-emitting element 420b is Vtop, and voltage applied to the lower potential side is Vbtm. The shield electrode 419 is provided between the sub-pixel 402G and another sub-pixel (not shown in FIG. 2D) and the voltage Vho is applied to the shield electrode. In this case, the voltage Vho is lower than the voltage Vtop applied to the higher potential side, and it is preferable to apply Vho which satisfies Vho≤Vtop−Vth. However, the shield electrode 419 may be in an electrically floating state. Further, even when n-channel transistors are used as the switching transistor 411 and the current control transistor 412, it is also possible to arrange the transistors as illustrated in the equivalent circuit diagram in FIG. 2C. In that case, the voltage Vho applied to the shield electrode 419 can be set in a manner similar to the voltage Vho in the case illustrated in FIG. 2C.

<Pixel Configuration 2>

Figure 4A:
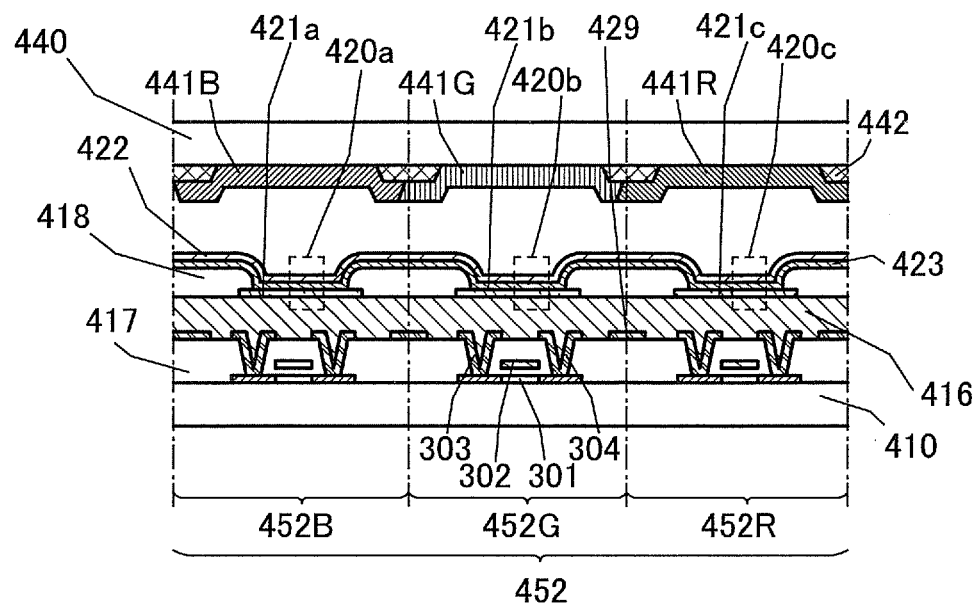
FIGS. 4A and 4B are cross-sectional views along a section line E-F in FIG. 2A.

The structure of a pixel 452 included in the display portion is described with reference to FIG. 4A. FIG. 4A is a cross-sectional view along a section line E-F in FIG. 2A. The pixel 452, sub-pixels 452B, 452G, and 452R, and a shield electrode 429 in FIG. 4A correspond to the pixel 402, the sub-pixels 402B, 402G and 402R, and the shield electrode 419 in FIG. 2A, respectively. In FIG. 4A, the same portions as those in the pixel configuration 1 are denoted by the same reference numerals and the description thereof is omitted.

<<Shield Electrode 429>>

The shield electrode 429, which is covered with the insulating layer 416, is formed over the insulating layer 417 such that the shield electrode does not overlap with the first to third lower electrodes 421a to 421c. Here, the expression "the shield electrode does not overlap with the first to third lower electrodes 421a to 421c" means that the shield electrode 429 does not overlap with the first to third lower electrodes 421a to 421c when seen in a plan view as shown in FIG. 2A.

A transistor is provided under the insulating layer 416. The transistor is formed in the insulating layer 417. This transistor includes a semiconductor layer 301, a gate electrode 302, a source electrode 303, and a drain electrode 304. The shield electrode 429 is formed using the same layer as the source electrode 303 and the drain electrode 304. In other words, the shield electrode 429 is formed in the same process where the source electrode 303 and the drain electrode 304 are formed. This transistor is a driver transistor (a switching transistor or a current control transistor) which is included in the sub-pixels 452B, 452G, and 452R, for example.

The shield electrode 429 in a lattice-like shape is provided so as to surround each of the sub-pixels 452B, 452G, and 452R. In other words, the shield electrode 429 is formed so as to surround each of the first to third lower electrodes 421a to 421c.

Note that although the shield electrode 429 is formed so as to surround each of the first to third lower electrodes 421a to 421c in the pixel configuration 2, the present invention is not limited to this configuration; for example, the shield electrodes 429 may be formed only between the first to third lower electrodes 421a to 421c. In other words, the shield electrodes 429 may be provided so as to separate the first to third lower electrodes 421a to 421c.

In a manner similar to the pixel configuration 1, voltage applied to the shield electrode 429 is a potential between the potential of the second lower electrode 421b and the potential of the upper electrode 422, or a floating potential. For example, in the case where the sub-pixel 452G has a structure as illustrated in the equivalent circuit diagram of FIG. 2C, voltage applied to the shield electrode 429 is preferably between the potential of the second lower electrode 421b and the potential of the upper electrode 422 and is preferably closer to the potential of the upper electrode 422 than to the potential of the second lower electrode 421b. Alternatively, in the case where the sub-pixel 452G has a structure as illustrated in the equivalent circuit diagram of FIG. 2D, voltage applied to the shield electrode 429 is preferably between the potential of the second lower electrode 421b and the potential of the upper electrode 422 and is preferably closer to the potential of the lower electrode 421b than to the potential of the upper electrode 422. Accordingly, occurrence of a crosstalk phenomenon in a light-emitting device can be inhibited.

<Pixel Configuration 3>

Figure 4B:
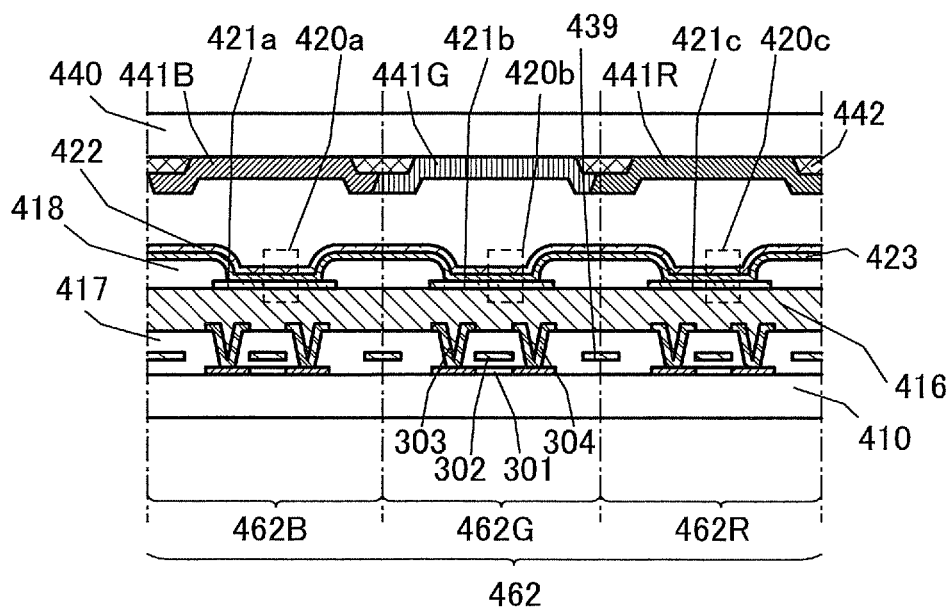

The structure of a pixel 462 included in the display portion is described with reference to FIG. 4B. FIG. 4B is a cross-sectional view along a section line E-F in FIG. 2A. The pixel 462, sub-pixels 462B, 462G, and 462R, and a shield electrode 439 in FIG. 4B correspond to the pixel 402, the sub-pixels 402B, 402G, and 402R, and the shield electrode 419 in FIG. 2A, respectively. In FIG. 4B, the same portions as those in the pixel configuration 1 are denoted by the same reference numerals and the description thereof is omitted.

<<<Shield Electrode 439>>

The shield electrode 439, which is covered with the insulating layer 417, is formed under the insulating layer 416 such that the shield electrode does not overlap with the first to third lower electrodes 421a to 421c.

The transistor includes the semiconductor layer 301, the gate electrode 302, the source electrode 303, and the drain electrode 304. The shield electrode 439 is formed using the same layer as the gate electrode 302. In other words, the shield electrode 439 is formed in the same process where the gate electrode 302 is formed. This transistor is a driver transistor (a switching transistor or a current control transistor) which is included in the sub-pixels 462B, 462G, and 462R, for example.

The shield electrode 439 in a lattice-like shape is provided so as to surround each of the sub-pixels 462B, 462G, and 462R. In other words, the shield electrode 439 is formed so as to surround each of the first to third lower electrodes 421a to 421c.

Note that although the shield electrode 439 is formed so as to surround each of the first to third lower electrodes 421a to 421c in the pixel configuration 3, the present invention is not limited to this configuration; for example, the shield electrodes 439 may be formed only between the first to third lower electrodes 421a to 421c. In other words, the shield electrodes 439 may be provided so as to separate the first to third lower electrodes 421a to 421c.

In a manner similar to the pixel configuration 1, voltage applied to the shield electrode 439 is a potential between the potential of the second lower electrode 421b and the potential of the upper electrode 422, or a floating potential. For example, in the case where the sub-pixel 462G has a structure as illustrated in the equivalent circuit diagram of FIG. 2C, voltage applied to the shield electrode 439 is preferably between the potential of the second lower electrode 421b and the potential of the upper electrode 422 and is preferably closer to the potential of the upper electrode 422 than to the potential of the second lower electrode 421b. Alternatively, in the case where the sub-pixel 462G has a structure as illustrated in the equivalent circuit diagram of FIG. 2D, voltage applied to the shield electrode 439 is preferably between the potential of the second lower electrode 421b and the potential of the upper electrode 422 and is preferably closer to the potential of the lower electrode 421b than to the potential of the upper electrode 422. Accordingly, occurrence of a crosstalk phenomenon in a light-emitting device can be inhibited.

<Pixel Configuration 4>

The structure of a pixel 472 included in the display portion is described with reference to FIG. 5A. The pixel 472 has a microresonator instead of the color filter illustrated in FIG. 2B.

Figure 5A:
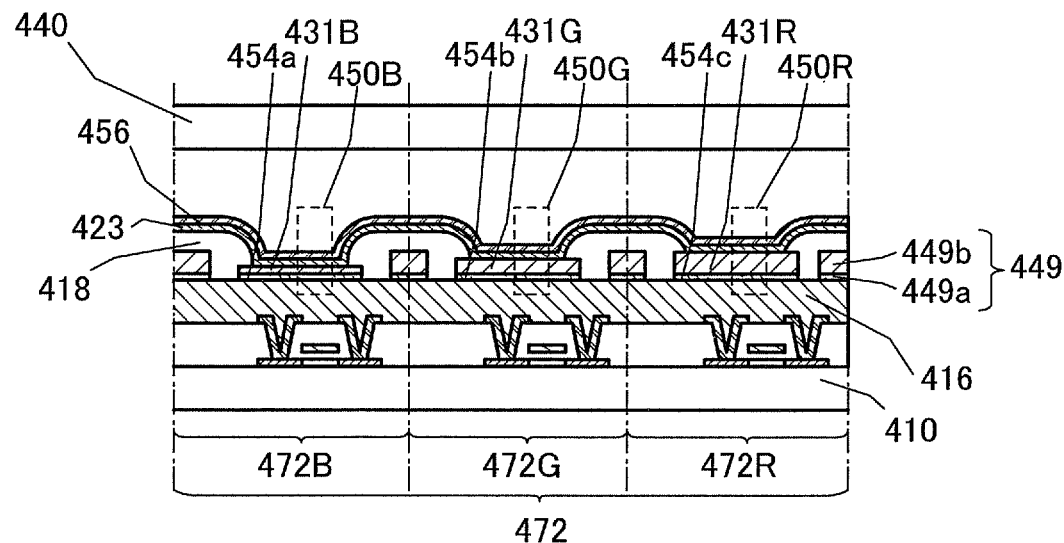
FIGS. 5A and 5B are cross-sectional views along a section line E-F in FIG. 2A.

FIG. 5A is a cross-sectional view along a section line E-F in FIG. 2A. The pixel 472, sub-pixels 472B, 472G, and 472R, and a shield electrode 449 in FIG. 5A correspond to the pixel 402, the sub-pixels 402B, 402G, and 402R, and the shield electrode 419 in FIG. 2A, respectively. In FIG. 5A, the same portions as those in the pixel configuration 1 are denoted by the same reference numerals and the description thereof is omitted.

The pixel 472 illustrated in FIG. 5A as an example includes the sub-pixel 472B that emits blue light, the sub-pixel 472G that emits green light, and the sub-pixel 472R that emits red light. The sub-pixel 472B includes a driver transistor and a first light-emitting element 450B. The sub-pixel 472G includes a driver transistor and a second light-emitting element 450G. The sub-pixel 472R includes a driver transistor and a third light-emitting element 450R. The shield electrode 449 which includes a first shield electrode 449a and a second shield electrode 449b is provided between the sub-pixels.

In each of the first, second, and third light-emitting elements 450B, 450G, and 450R which are included in the sub-pixels 472B, 472G, and 472R, a reflective film and a semi-transmissive and semi-reflective film are stacked, thereby forming a microresonator. The EL layer 423 is provided between the reflective film and the semi-transmissive and semi-reflective film. In FIG. 5A, first, second, and third lower electrodes 454a, 454b, and 454c which have reflectivities are each provided as the reflective film, and an upper electrode 456 which has a semi-transmissive and semi-reflective property is provided as the semi-transmissive and semi-reflective film. In this manner, light with a specific wavelength can be efficiently extracted through the upper electrode 456 having a semi-transmissive and semi-reflective property. The light extraction efficiency can be increased by adjusting the optical path length of the microresonator so as to increase the intensity of the extracted light. The wavelength of extracted light depends on the distance between the reflective film and the semi-transmissive and semi-reflective film, and the distance can be adjusted by forming an optical adjustment layer between the reflective film and the semi-transmissive and semi-reflective film. Note that the EL layer 423 and the upper electrode 456 are common between the sub-pixels.

The first light-emitting element 450B included in the sub-pixel 472B includes, between the first lower electrode 454a having reflectivity and the upper electrode 456 having a semi-transmissive and semi-reflective property, an optical adjustment layer 431B for adjusting the optical path length between the first lower electrode 454a and the upper electrode 456 so as to increase the intensity of blue light (light with a wavelength longer than or equal to 400 nm and shorter than 500 nm). Owing to the optical adjustment layer 431B, blue light can be efficiently extracted.

The second light-emitting element 450G included in the sub-pixel 472G includes, between the second lower electrode 454b having reflectivity and the upper electrode 456 having a semi-transmissive and semi-reflective property, an optical adjustment layer 431G for adjusting the optical path length between the second lower electrode 454b and the upper electrode 456 so as to increase the intensity of green light (light with a wavelength longer than or equal to 500 nm and shorter than 600 nm). Owing to the optical adjustment layer 431G, green light can be efficiently extracted.

The third light-emitting element 450R included in the sub-pixel 472R includes, between the third lower electrode 454c having reflectivity and the upper electrode 456 having a semi-transmissive and semi-reflective property, an optical adjustment layer 431R for adjusting the optical path length between the third lower electrode 454c and the upper electrode 456 so as to increase the intensity of red light (light with a wavelength longer than or equal to 600 nm and shorter than 800 nm). Owing to the optical adjustment layer 431R, red light can be efficiently extracted.

In the first, second, and third light-emitting elements 450B, 450G, and 450R with the above-described structures, interference of light emitted from the EL layer 423 occurs between the reflective film and the semi-transmissive and semi-reflective film, and thus the intensity of light with a specific wavelength among light with a wavelength longer than or equal to 400 nm and shorter than 800 nm is increased.

A conductive film having light-transmitting properties to visible light or a layer containing a light-emitting organic compound can be employed for a material that can be used for the optical adjustment layer. For example, the thickness of a charge-generation region may be adjusted so that the charge-generation region also serves as the optical adjustment layer. Alternatively, the thickness of a region containing a substance having a high hole-transport property and a substance exhibiting an acceptor property with respect to the substance having a hole-transport property may be adjusted so that the layer of the mixed substances also serves as the optical adjustment layer. This structure is preferably used because an increase in driving voltage can be inhibited even when the optical adjustment layer is thick.

The thickness of the optical adjustment layer is adjusted in accordance with the wavelength of light extracted from the light-emitting element.

<<Shield Electrode 449>>

In the example illustrated in FIG. 5A, the stacked-layer structure of the shield electrode 449 between the sub-pixels includes the following: the first shield electrode 449a formed in the same process where the first, second, and third lower electrodes 454a, 454b, and 454c of the first, second, and third light-emitting elements 450B, 450G, and 450R are formed; and the second shield electrode 449b formed in the same process where the optical adjustment layer 431R of the third light-emitting element 450R is formed. However, the present invention is not limited to this structure. For example, it is possible to employ a stacked-layer structure which includes the first shield electrode 449a and an electrode layer formed in the same process where the optical adjustment layer 431B of the first light-emitting element 450B is formed. It is also possible to employ a stacked-layer structure which includes the first shield electrode 449a and an electrode layer formed in the same process where the optical adjustment layer 431G of the second light-emitting element 450G is formed.

<Pixel Configuration 5>

Figure 5B:
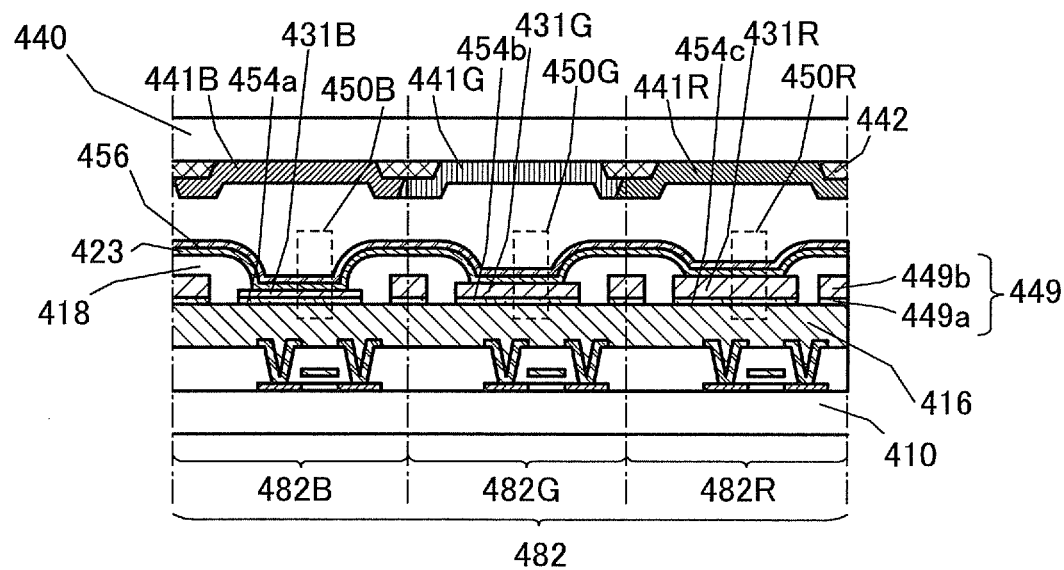

The structure of a pixel 482 included in the display portion is described with reference to FIG. 5B. The pixel 482 illustrated in FIG. 5B is a variation of the pixel 472 illustrated in FIG. 5A. In the pixel 482, the color filters 441B, 441G, and 441R and the light-blocking film 442 are provided on the second substrate 440 side. That is, the pixel 482 is provided with both the color filters and microresonators.

In FIG. 5B, the sub-pixel 482B includes a driver transistor, the first light-emitting element 450B, and the color filter 441B which transmits blue light. The sub-pixel 482G includes a driver transistor, the second light-emitting element 450G, and the color filter 441G which transmits green light. The sub-pixel 482R includes a driver transistor, the third light-emitting element 450R, and the color filter 441R which transmits red light.

The color filters, which absorb unnecessary light, are added to the structure illustrated in FIG. 5A, whereby color purities can be increased. Note that components other than the color filters are similar to the components in FIG. 5A, and thus detailed description thereof is omitted.

EXAMPLE

In Example, a display panel of one embodiment of the present invention in which a shield electrode is provided between sub-pixels was fabricated, and the presence or absence of crosstalk was checked.

Figure 6A:
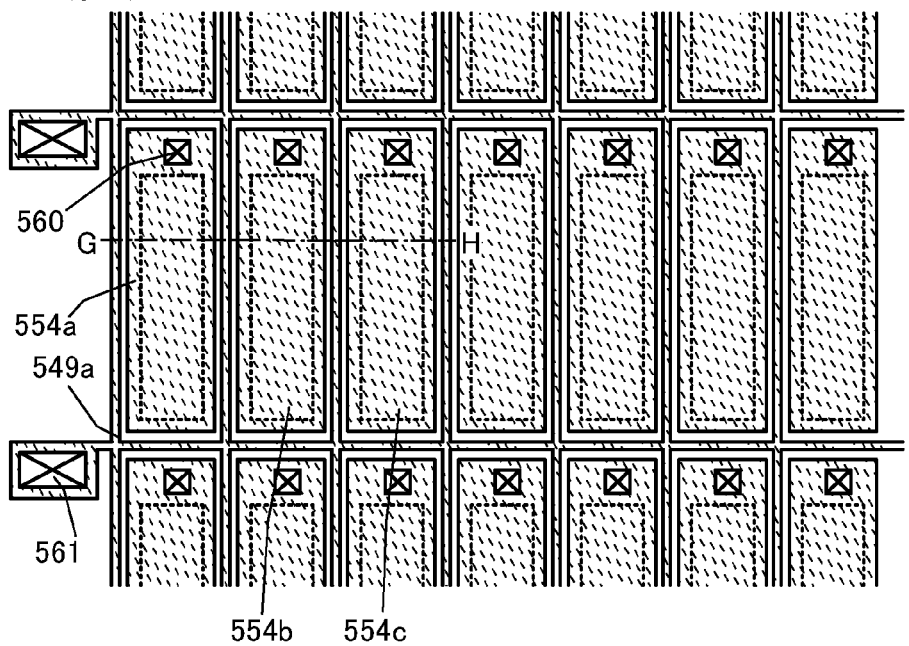
FIGS. 6A to 6C are enlarged views illustrating a pixel portion of a display panel fabricated in Example.
Figure 6B:
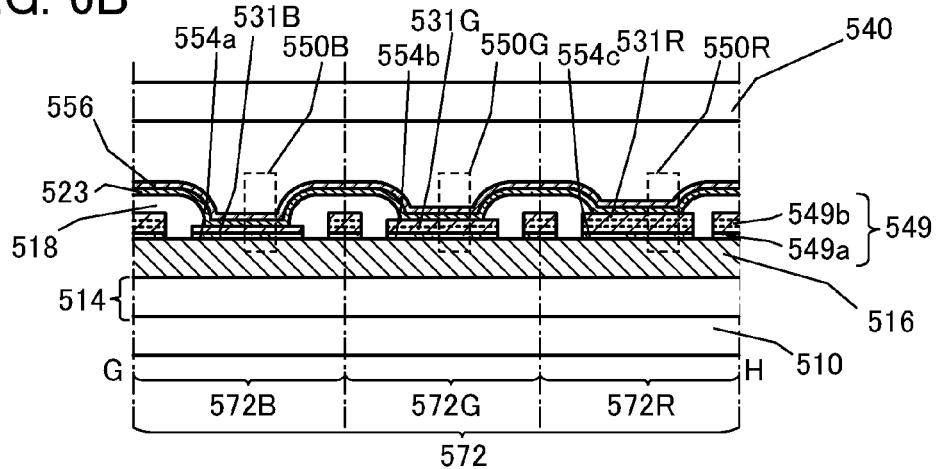
Figure 6C:
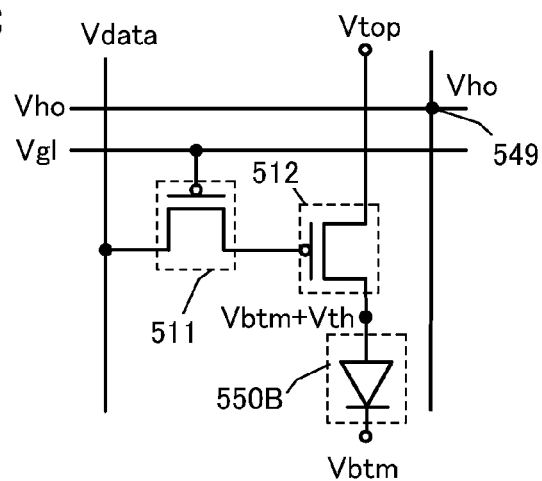

FIGS. 6A to 6C are enlarged views illustrating a pixel portion of the display panel fabricated in Example. FIG. 6A is a plan view of the pixel portion of the display panel. FIG. 6B is a cross-sectional view along G-H in FIG. 6A. FIG. 6C is an equivalent circuit diagram illustrating a sub-pixel 572B.

Note that in FIG. 6A, some components (e.g., an upper electrode 556, an EL layer 523, and a partition 518) are omitted in order to clearly show positions of a first lower electrode 554a functioning as a pixel electrode, and a first shield electrode 549a formed using the same layer as the first lower electrode 554a. In FIG. 6A, dotted lines in first, second, and third lower electrodes 554a, 554b, and 554c denote opening portions of the pixel.

The pixel 572 of the display panel which was fabricated in Example was formed over a first substrate 510 provided with an element formation layer 514 including a driver transistor, with an insulating layer 516 provided between the pixel 572 and the first substrate 510. As the first substrate 510, a glass substrate with a thickness of 700 µm was used. The thickness of the element formation layer 514 was set to 1560 nm. For the insulating layer 516, an insulating resin material was used and the thickness was set to 2.5 µm.

The pixel 572 includes the sub-pixel 572B emitting blue light (also referred to as blue sub-pixel), a sub-pixel 572G emitting green light (also referred to as green sub-pixel), a sub-pixel 572R emitting red light (also referred to red sub-pixel), and the shield electrode 549 having a lattice-like shape between the sub-pixels. The sub-pixels 572B, 572G, and 572R include first, second, and third light-emitting elements 550B, 550G, and 550R, respectively.

The first, second, and third light-emitting elements 550B, 550G, and 550R each include an optical adjustment layer and the EL layer 523 between the upper electrode 556 having a semi-transmissive and semi-reflective property and the first, second, and third lower electrodes 554a, 554b, and 554c having reflectivities. The EL layer 523 and the upper electrode 556 are common between the light-emitting elements. In Example, the upper electrode 556 over the EL layer 523 having a thickness of 200 nm was formed using a 85-nm-thick silver film or a 85-nm-thick aluminum alloy film.

For the first to third lower electrodes 554a to 554c and the first shield electrode 549a, a stacked-layer film in which a 100-nm-thick aluminum film was stacked over a 100-nm-thick indium oxide-tin oxide (ITO: indium tin oxide) film was patterned by photolithography and formed.

In the first light-emitting element 550B, a 19-nm-thick indium oxide-zinc oxide film was formed as an optical adjustment layer 531B over the first lower electrode 554a.

In the second light-emitting element 550G, a 40-nm-thick indium oxide-zinc oxide film and a 19-nm-thick indium oxide-zinc oxide film were stacked over the second lower electrode 554b to form an optical adjustment layer 531G. Note that since a boundary between layers is unclear in a stacked-layer structure including indium oxide-zinc oxide films which use materials of the same kind, such a boundary is schematically denoted by a dotted line in FIG. 6B.

In the third light-emitting element 550R, a 40-nm-thick indium oxide-zinc oxide film, a 40-nm-thick indium oxide-zinc oxide film, and a 19-nm-thick indium oxide-zinc oxide film were stacked over the third lower electrode 554c to form an optical adjustment layer 531R.

The shield electrode 549 has a stacked-layer structure which includes the following: the first shield electrode 549a formed in the same process where the first, second, and third lower electrodes 554a, 554b, and 554c in the first, second, and third light-emitting elements were formed; and a second shield electrode 549b formed in the same process where the optical adjustment layer 531R in the third light-emitting element 550R was formed. That is, the shield electrode 549 includes the first shield electrode 549a in which the 100-nm-thick aluminum film is stacked over the 100-nm-thick ITO film, and the second shield electrode 549b in which the 40-nm-thick indium oxide-zinc oxide film, the 40-nm-thick indium oxide-zinc oxide film, and the 19-nm-thick indium oxide-zinc oxide film are stacked.

Note that as illustrated in FIG. 6A, the first, second, and third lower electrodes 554a, 554b, and 554c are electrically connected to transistors provided in the element formation layer 514, through contact holes 560. The first shield electrode 549a is electrically connected to a transistor provided in the element formation layer 514, through a contact hole 561.

A partition 518 covering the shield electrode 549 was formed using an insulating resin material and the thickness of the partition was set to 2 μm.

A second substrate 540 is provided over the first, second, and third light-emitting elements 550B, 550G, and 550R with a 5- to 7-μm-thick sealing resin material provided therebetween. As the second substrate 540, a glass substrate with a thickness of 700 μm was used.

In the display panel fabricated in Example, the sub-pixel is 114 μm square, the width of the shield electrode 549 between the sub-pixels is 3 μm, a gap between the shield electrode 549 and the sub-pixel is 3 μm, and a distance between an end portion of each of the first to third lower electrodes 554a to 554c and an end portion of the opening portion is 4 μm.

The presence or absence of crosstalk in the display panel of Example which has the above structure was checked. Specifically, luminance-chromaticity characteristics per the pixel 572 at the time when the blue sub-pixel 572B emits light were measured, and a luminance ratio of red and green components was calculated. The measurement conditions are as follows.

As a switching transistor 511 and a current control transistor 512 of the blue sub-pixel 572B, p-channel transistors were used (see FIG. 6C). The voltage Vtop applied to the higher potential side of the first light-emitting element 550B was set to 6 V, the voltage Vbtm applied to the lower potential side was set to −2 V, the pixel selection voltage Vgl was set to −6 V, the pixel gray scale data signal voltage Vdata at the time when the transistor was in an on state was set to −6 V, and the pixel gray scale data signal voltage Vdata at the time when the transistor was in an off state was set to 6 V, so that the first light-emitting element 550B emitted light. The potential of the shield electrode 549 was changed at an interval of 2 V from 10 V to −14 V. Further, the potential of the shield electrode 549 was not fixed, in which case the shield electrode was in a floating potential state (an open state).

Light emitted from the display panel was imaged with a luminance camera provided with a charge-coupled device (CCD), and digital image data of a luminance value of a pixel column which was subjected to imaging was processed with the use of software and examined.

As the luminance camera, Prometric 1400 Color manufactured by Radiant Imaging, Inc. was used. A distance between a lens surface and the sample at the time of imaging was about 70 mm. The digital image data was processed using Prometric Software manufactured by Radiant Imaging, Inc.

Figure 7:
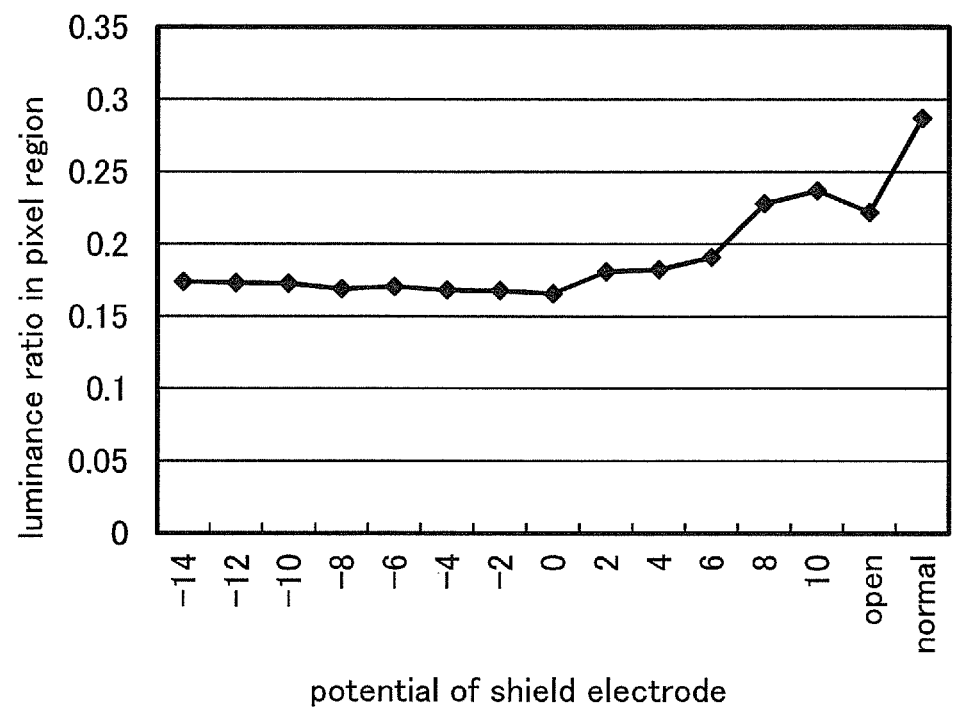
FIG. 7 shows relation between a potential of a shield electrode 549 and luminance-chromaticity characteristics of a light-emitting panel in the case where a first light-emitting element 550B in Example emits light.
Figure 8A:
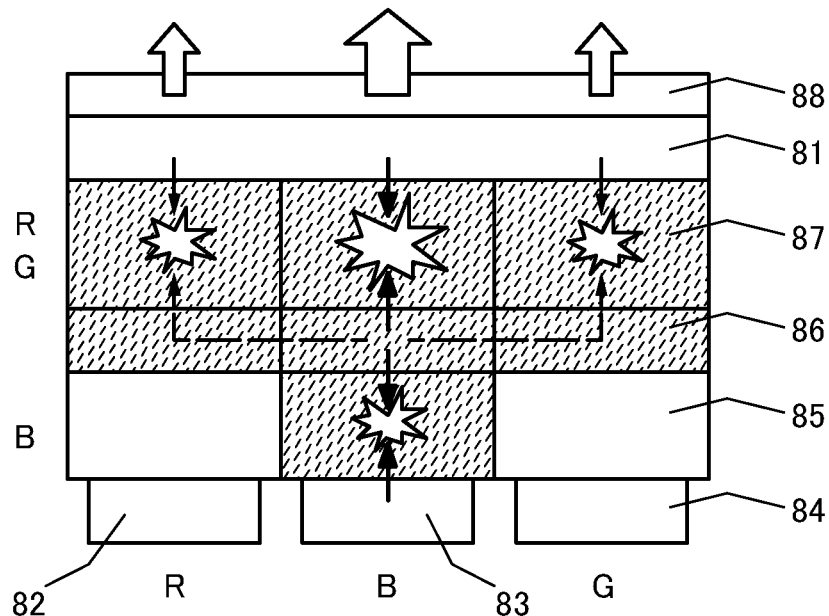
FIG. 8A is a schematic diagram for describing a crosstalk phenomenon caused by a highly conductive intermediate layer.
Figure 8B:
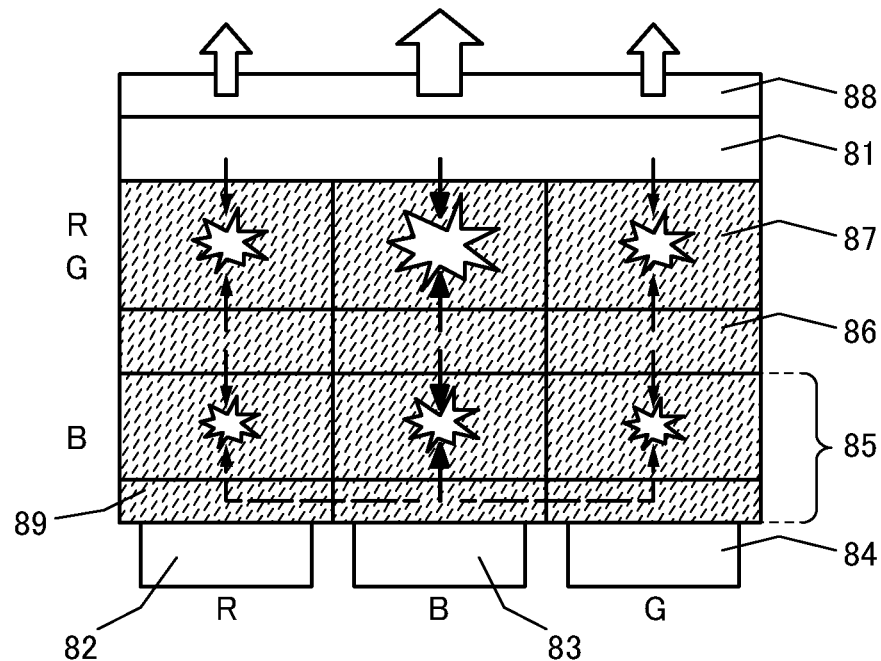
FIG. 8B is a schematic diagram for describing the crosstalk phenomenon caused by a highly conductive carrier-injection layer.

FIG. 7 shows relation between the potential of the shield electrode 549 and the luminance-chromaticity characteristics of the light-emitting panel in the case where the first light-emitting element 550B in Example emitted light. In FIG. 7, the vertical axis represents a luminance ratio of a red component or a green component with respect to luminance in a pixel region (luminance of light which contains red, green, and blue components). The closer to zero the luminance ratio is, the more red light emission and green light emission are inhibited and the more crosstalk is reduced. The horizontal axis in FIG. 7 represents the potential of the shield electrode 549. Note that the value of the "normal" in FIG. 7 shows, as a reference example, a luminance ratio of red and green components in a pixel without the shield electrode 549.

As can be seen from FIG. 7, the "normal" pixel showed a luminance ratio of red and green components of 0.29; the light-emitting panel of Example showed a reduction in luminance ratio of red and green components, which was 0.24, even with the shield electrode 549 in a floating potential state (open state). It was thus shown that crosstalk between the sub-pixels can be effectively reduced when the shield electrode 549 is provided in the light-emitting panel of Example.

Further, when the voltage applied to the shield electrode 549 was about 4 V or lower, the luminance ratio of red and green components was considerably reduced to about 0.17. Since the threshold voltage of the first light-emitting element 550B used in Example is about 6 V, the above results proved that by setting the potential of the shield electrode 549 to lower than or equal to the sum of the threshold voltage of the light-emitting element and the voltage applied to the lower potential side of the light-emitting element, crosstalk can be inhibited more effectively.

This application is based on Japanese Patent Application serial no. 2013-024342 filed with Japan Patent Office on Feb. 12, 2013, the entire contents of which are hereby incorporated by reference.

What is claimed is:

1. A light-emitting device comprising:
a plurality of sub-pixels;
an insulating layer;
a first lower electrode over the insulating layer in one of the plurality of sub-pixels;
a second lower electrode over the insulating layer in another one of the plurality of sub-pixels;
a partition over the insulating layer, the partition positioned between the first lower electrode and the second lower electrode;
a stacked-layer film over the first lower electrode, the partition, and the second lower electrode, the stacked-layer film comprising a light-emitting layer containing a light-emitting substance and a layer having higher conductivity than a conductivity of the light-emitting layer;
an upper electrode over the stacked-layer film; and
a third electrode under the partition, and between the first lower electrode and the second lower electrode,
wherein a length in a longitudinal direction of the third electrode is longer than a length in a longitudinal direction of any of the plurality of sub-pixels.

2. The light-emitting device according to claim 1,
wherein the third electrode spaces the first lower electrode from the second lower electrode.

3. The light-emitting device according to claim 1,
wherein the third electrode is over the insulating layer.

4. The light-emitting device according to claim 3,
wherein the third electrode is in the same layer as the first lower electrode.

5. The light-emitting device according to claim 3, further comprising:
an optical adjustment layer between the first lower electrode and the stacked-layer film,
wherein the third electrode is a stack comprising a layer in the same layer as the first lower electrode and a layer in the same layer as the optical adjustment layer.

6. The light-emitting device according to claim 1,
wherein the third electrode is under the insulating layer.

7. The light-emitting device according to claim 6, further comprising:
a transistor under the insulating layer,
wherein the transistor comprises a semiconductor layer, a gate electrode, a source electrode, and a drain electrode, and
wherein the third electrode is in the same layer as the source electrode.

8. The light-emitting device according to claim 6, further comprising:
a transistor under the insulating layer,
wherein the transistor comprises a semiconductor layer, a gate electrode, a source electrode, and a drain electrode, and
wherein the third electrode is in the same layer as the gate electrode.

9. The light-emitting device according to claim 1,
wherein the third electrode is in an electrically floating state.

10. The light-emitting device according to claim 1,
wherein the third electrode is configured to be supplied with a potential which is lower than a first potential that is applied to one of the first lower electrode and the upper electrode, and
wherein the first potential is higher than a second potential that is applied to the other of the first lower electrode and the upper electrode when light is emitted by applying a potential difference between the first potential and the second potential between the first lower electrode and the upper electrode.

11. The light-emitting device according to claim 10,
wherein the third electrode is configured to be supplied with a potential which is lower than or equal to a sum of a threshold voltage of light emission and the second potential.

12. The light-emitting device according to claim 1, further comprising:
a first color filter over the upper electrode, the first color filter having a first color and overlapping with the first lower electrode; and
a second color filter over the upper electrode, the second color filter having a second color and overlapping with the second lower electrode.

13. A light-emitting device comprising:
an insulating layer;
a plurality of lower electrodes over the insulating layer;
a partition over the insulating layer, the partition positioned between the plurality of lower electrodes and surrounding each of the plurality of lower electrodes;
a stacked-layer film over the plurality of lower electrodes and the partition, the stacked-layer film comprising a light-emitting layer containing a light-emitting substance and a layer having higher conductivity than a conductivity of the light-emitting layer;
an upper electrode over the stacked-layer film; and
a third electrode under the partition, and between the plurality of lower electrodes and surrounding each of the plurality of lower electrodes.

14. The light-emitting device according to claim 13,
wherein the third electrode spaces each of the plurality of lower electrodes.

15. The light-emitting device according to claim 13,
wherein the third electrode is over the insulating layer.

16. The light-emitting device according to claim 15,
wherein the third electrode is in the same layer as the plurality of lower electrodes.

17. The light-emitting device according to claim 15, further comprising:
an optical adjustment layer between the plurality of lower electrodes and the stacked-layer film,
wherein the third electrode is a stack comprising a layer in the same layer as the plurality of lower electrodes and a layer in the same layer as the optical adjustment layer.

18. The light-emitting device according to claim 13,
wherein the third electrode is under the insulating layer.

19. The light-emitting device according to claim 18, further comprising:
a transistor under the insulating layer,
wherein the transistor comprises a semiconductor layer, a gate electrode, a source electrode, and a drain electrode, and
wherein the third electrode is in the same layer as the source electrode.

20. The light-emitting device according to claim 18, further comprising:
a transistor under the insulating layer,
wherein the transistor comprises a semiconductor layer, a gate electrode, a source electrode, and a drain electrode, and
wherein the third electrode is in the same layer as the gate electrode.

21. The light-emitting device according to claim 13,
wherein the third electrode is in an electrically floating state.

22. The light-emitting device according to claim 13,
wherein the third electrode is configured to be supplied with a potential which is lower than a first potential that is applied to one of the lower electrode and the upper electrode, and
wherein the first potential is higher than a second potential that is applied to the other of the lower electrode and the upper electrode when light is emitted by applying a potential difference between the first potential and the second potential between the lower electrode and the upper electrode.

23. The light-emitting device according to claim 22,
wherein the third electrode is configured to be supplied with a potential which is lower than or equal to a sum of a threshold voltage of light-emission and the second potential.

* * * * *